United States Patent
Sato et al.

(10) Patent No.: US 7,790,499 B2
(45) Date of Patent: Sep. 7, 2010

(54) OBSERVATION APPARATUS AND METHOD FOR OBSERVING VOID IN UNDERFILL RESIN

(75) Inventors: Masahiko Sato, Kawasaki (JP);
Kazuyuki Ikura, Kawasaki (JP); Toru Nishino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 108 days.

(21) Appl. No.: 11/877,051

(22) Filed: Oct. 23, 2007

(65) Prior Publication Data
US 2008/0194047 A1      Aug. 14, 2008

(30) Foreign Application Priority Data
Feb. 9, 2007   (JP) .............................. 2007-030423

(51) Int. Cl.
   *H01L 21/44*   (2006.01)
(52) U.S. Cl. ..................................................... 438/106
(58) Field of Classification Search ........................ None
See application file for complete search history.

(56) References Cited

U.S. PATENT DOCUMENTS 5,912,320 A * 6/1999 Hotta et al. ................. 528/373

2006/0030071 A1 * 2/2006 Mizukoshi et al. .......... 438/106
2009/0008800 A1 * 1/2009 Nakatani et al. ............ 257/778

FOREIGN PATENT DOCUMENTS

JP           6425045 A        1/1989
JP           9196617 A        7/1997
WO        2006/103918 A1   10/2006

OTHER PUBLICATIONS

Korean Office Action dated Sep. 30, 2009 issued in corresponding Korean Patent Application No. 10-2007-0122721.
Korean Office Action dated Nov. 30, 2009 issued in corresponding Korean Patent Application No. 10-2007-0122721.

* cited by examiner

*Primary Examiner*—Charles D Garber
*Assistant Examiner*—Andre' C Stevenson
(74) *Attorney, Agent, or Firm*—Westerman, Hattori, Daniels & Adrian, LLP

(57) ABSTRACT

A disclosed observation apparatus for observing a void generated in an underfill resin upon mounting a body to be mounted on a substrate via the underfill resin in flip-chip mounting includes: a mounting unit mounting the body to be mounted on the substrate; and an observation unit observing behavior of the underfill resin while the mounting unit is mounting the body to be mounted on the substrate.

8 Claims, 14 Drawing Sheets

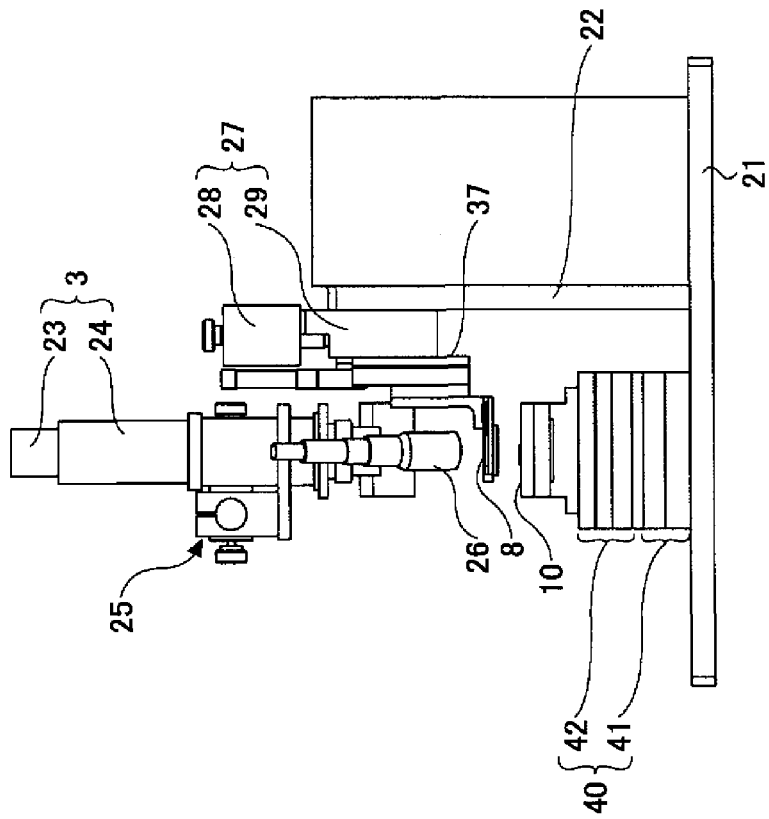
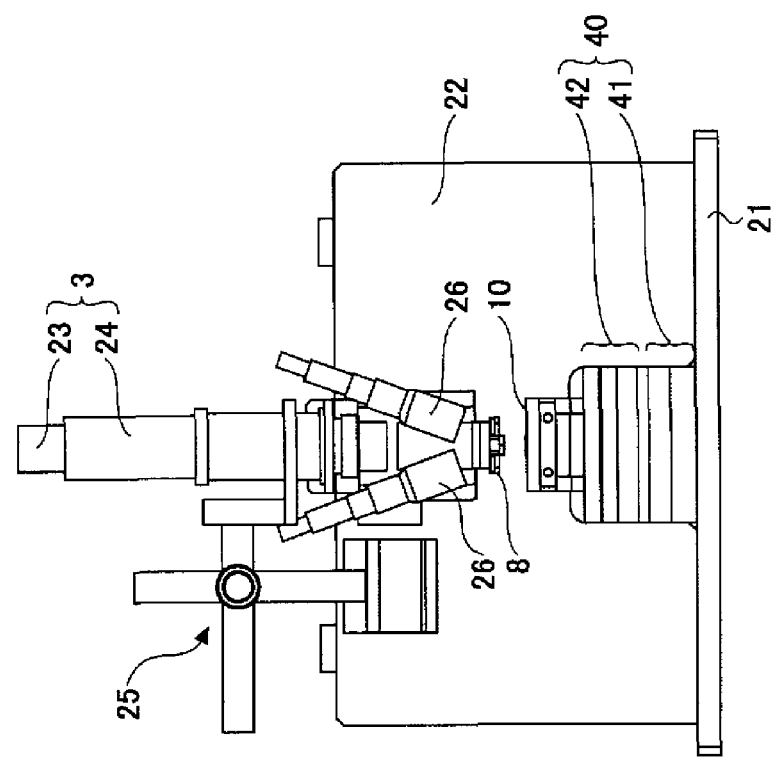

OBSERVATION APPARATUS AND METHOD FOR OBSERVING VOID IN UNDERFILL RESIN

BACKGROUND OF THE INVENTION

1. Field of the Invention

The present invention generally relates to an observation apparatus and a method for manufacturing an electronic device and more particularly to an observation apparatus and a method for manufacturing an electronic device in which an underfill resin is disposed on an electronic component.

2. Description of the Related Art

There has been known flip-chip mounting as a method for mounting an electronic component such as a semiconductor chip (hereafter referred to as a chip component) on a mounting substrate. The flip-chip mounting method is for forming a gold (Au) bump on an electrode of a chip component and connecting the chip face down to the mounting substrate. In the flip-chip mounting method, underfill resin (resin bond) is filled between the chip component and the substrate so as to reinforce the connection between the Au bump and the electrode.

Preferably, the underfill resin is filled in a connection space in a uniform manner. However, a void (air gap) may be generated in the underfill resin during a step of coating the underfill resin or a step of mounting the chip. This affects connection strength and quality. In view of this there have been various methods for detecting the void generated in the underfill resin (refer to Patent Documents 1 and 2)

Patent Document 1: Japanese Laid-Open Patent Application No. 64-025045

Patent Document 2: Japanese Laid-Open Patent Application No. 09-196617

However, the conventional methods disclosed in Patent Documents 1 and 2 are for examining the presence of the void through observation of X-ray transmission and a cross section of mounting after the chip is mounted. Thus, the conventional method is capable of detecting the presence of the generated void and a position thereof after the chip is mounted. However, this method poses a problem in that the method is not capable of observing how the void is generated, so that a cause of the generation of the void remains unclear and it is not possible to determine conditions of steps of the flip-chip mounting so as to control the generation of the void.

SUMMARY OF TEE INVENTION

It is a general object of the present invention to provide an improved and useful observation apparatus and a method for manufacturing an electronic device in which the above-mentioned problems are eliminated.

A more specific object of the present invention is to provide an observation apparatus and a method for manufacturing an electronic device that can visualize a flow status of the underfill resin, namely, behavior of the void in the step of mounting the chip.

According to one aspect of the present invention, there is provided an observation apparatus for observing a void generated in an underfill resin upon mounting a body to be mounted on a substrate via the underfill resin in flip-chip mounting, the observation apparatus comprising: a mounting unit mounting the body to be mounted on the substrate; and an observation unit observing behavior of the underfill resin while the mounting unit is mounting the body to be mounted on the substrate.

According to another aspect of the present invention, in the observation apparatus, the mounting unit may include a head holding the body to be mounted and a stage installing the substrate thereon, and the observation unit may include an imaging unit imaging the behavior of the underfill resin.

According to another aspect of the present invention, in the observation apparatus, a first opening may be formed at a position of the head for imaging the body to be mounted, and the imaging unit may be disposed at a position opposite to the first opening.

According to another aspect of the present invention, in the observation apparatus, a second opening may be formed at a position of the stage for imaging the substrate, and the imaging unit may be disposed at a position opposite to the second opening.

According to another aspect of the present invention, in the observation apparatus, a heater heating the body to be mounted or the substrate may be disposed on at least one of the head and the stage.

According to another aspect of the present invention, in the observation apparatus, at least one of the head and the stage may be formed using a transparent material.

According to another aspect of the present invention, the observation apparatus may include: a pressure regulating unit regulating pressure of the head applied to the stage.

According to another aspect of the present invention, in the observation apparatus, the body to be mounted may be a glass chip.

According to another aspect of the present invention, in the observation apparatus, an X-ray camera or an infrared camera may be used as the imaging unit.

According to another aspect of the present invention, there is provided a method for manufacturing an electronic device, comprising the steps of: mounting an electronic component on a mounting substrate via an underfill resin in flip-chip mounting; and observing a void generated in the underfill resin during the mounting step.

According to the present invention, it is possible to observe the behavior (flow status) of the underfill resin in a real-time manner while the body to be mounted is being mounted under actual mounting conditions.

Other objects, features and advantage of the present invention will become more apparent from the following detailed description when read in conjunction with the accompanying drawings.

BRIEF DESCRIPTION OF THE DRAWINGS

FIG. 3A is a front view showing an observation apparatus according to an embodiment of the present invention;

FIG. 3B is a right side view showing an observation apparatus according to an embodiment of the present invention;

DETAILED DESCRIPTION OF THE PREFERRED EMBODIMENTS

In the following, embodiments of the present invention will be described with reference to the accompanying drawings.

Figure 1:
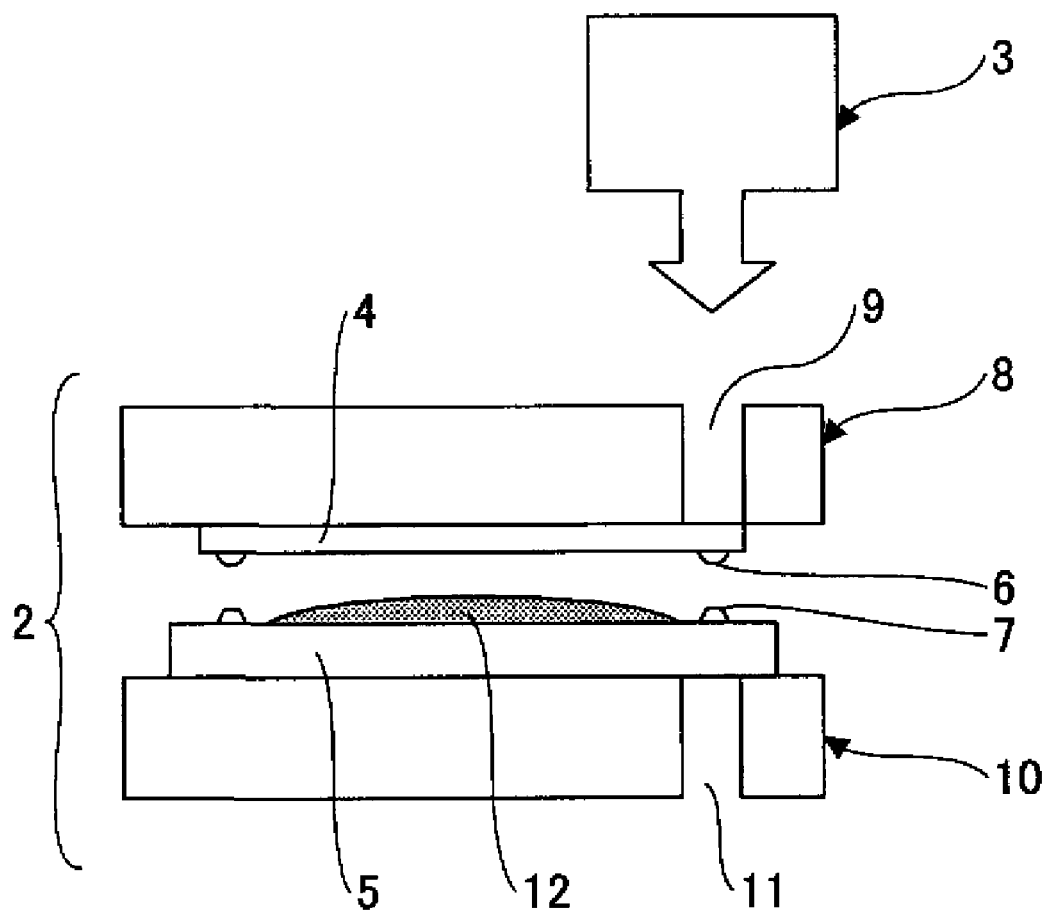
FIG. 1 is a diagram showing a basic structure of an observation apparatus according to the present invention.

FIG. 1 is a diagram showing a basic structure of an observation apparatus 1 according to the present invention. The observation apparatus 1 substantially includes a mounting unit 2 and an observation unit 3. The observation apparatus 1 is for observing a void 13 (refer to FIG. 10) generated in an underfill resin 12 upon flip-chip mounting in which a body 4 to be mounted is mounted on a substrate 5 via the underfill resin 12.

The flip-chip mounting is for forming a bump 6 on the body 4 to be mounted and forming an electrode 7 on the substrate 5 and connecting the body 4 to be mounted to the substrate 5 in a face-down manner such that the bump 6 is directly connected to the electrode 7. In accordance with the flip-chip mounting, it is possible to deal with multiple pins and to improve efficiency of mounting in comparison with other bonding method such as wire bonding.

The mounting unit 2 is for mounting the body 4 to be mounted on the substrate 5. The mounting unit 2 includes a head 8 and an installation stage 10. The body 4 to be mounted is installed on the head 8 and the substrate 5 is installed on the installation stage 10. The head 8 is configured to be movable to the installation stage 10. Further, in the head 8, a first opening 9 is formed so as to penetrate upward and downward directions in the drawing. In the same manner, in the installation stage 10, a second opening 11 is formed so as to penetrate upward and downward directions in the drawing.

The observation unit 3 employs an imaging camera, for example. The observation unit 3 is disposed at a position opposite to the first opening 9 formed in the head 8 or a position opposite to the second opening 11 formed in the installation stage 10. In the example shown in FIG. 1, the observation unit 3 is disposed at the position opposite to the first opening 9.

The body 4 to be mounted and the substrate 5 are formed using a transparent material such as glass. Accordingly, when the mounting unit 2 is used in a process of mounting the body 4 to be mounted on the substrate 5 where the underfill resin 12 is placed, it is possible to observe behavior of the underfill resin 12 during the mounting process by observing, using the observation unit 3, the body 4 to be mounted via the first opening 9, the body 4 to be mounted being installed on the head 8.

In this manner, according to the observation apparatus 1, in actual mounting conditions under which the body 4 to be mounted is mounted on the substrate 5, it is possible to observe the behavior (flow status) of the underfill resin 12 accompanied by the mounting of the body 4 to be mounted on the substrate 5 in a real-time manner. Thus, based on a result of this observation, it is possible to determine a cause of the generation of the void 13.

Moreover, it is also possible to observe the behavior (flow status) of the underfill resin 12 from the substrate 5 via the second opening 11 in a real-time manner, so that it is possible to observe the behavior of the underfill resin 12 from plural directions. In the example shown in FIG. 1, the first opening 9 and the second opening 11 are positioned in the vicinity where the bump 6 or the electrode 7 is formed. However, the positions where each of the first opening 9 and the second opening 11 is formed are not limited in particular and the first opening 9 and the second opening 11 are formed at any position.

Further, FIG. 1 shows the example employing a normal imaging camera as the observation unit 3, so that the first opening 9 and the second opening 11 are formed in the head 8 and the installation stage 10 and the body 4 to be mounted and the substrate 5 are formed using a transparent material. However, by employing an X-ray imaging camera or an infrared camera as the observation unit 3, it is possible to observe the behavior of the underfill resin 12 without forming the first opening 9 or second opening 11 in the head 8 or the installation stage 10 or using a transparent substance as the body 4 to be mounted or the substrate 5.

Next, an observation apparatus 20 according to an embodiment of the present invention based on the above-mentioned basic structure is described with reference to FIGS. 2 to 12. The same numerals are assigned to the elements or portions corresponding to those shown in FIG. 1 and description thereof is omitted.

Firsts an entire structure of the observation apparatus 20 is described with reference to FIGS. 2 to 4C. The observation apparatus 20 substantially includes the observation unit 3, the head 8, the installation stage 10, a base 21, a camera stage 25, a head movement mechanism 27, a pressure regulating mechanism 30, a stage movement device 40, a control device 50 (refer to FIG. 11), and the like. The above-mentioned head 8, installation stage 10, head movement mechanism 27, pressure regulating mechanism 30, and stage movement device 40 constitute a mounting unit.

On the base 21, a support plate 22 is installed in an upright manner. The support plate 22 includes the observation unit 3, head 8, camera stage 25, head movement mechanism 27, pressure regulating mechanism 30, and the like disposed thereon.

The observation unit 3 includes an imaging camera 23 and a lens unit 24. The imaging camera 23 employs a high-speed camera capable of photographing high-speed images and generating images at a rate of not less than 200 frames per second, for example. The imaging camera 23 is connected to the control device 50 constructed using a PC and the like and functioning also as an image processing device. Image data on photographed images is transmitted to the control device 50. In addition, the imaging camera 23 used in the present embodiment employs a normal imaging camera without using an X-ray imaging camera or an infrared camera.

The lens unit 24 is disposed below the imaging camera 23. The lens unit 24 has a function of magnifying an imaging position, so that the behavior of the underfill resin 12 described later is magnified by the lens unit 24 and is photographed by the imaging camera 23. The imaging camera 23 and the lens unit 24 (observation unit 3) are installed on the camera stage 25.

The camera stage 25 is disposed on the support plate 22. The camera stage 25 supports the observation unit 3 relative to the support plate 22 and is capable of fine adjustment of an imaging position for the imaging camera 23. In accordance with this, it is possible to adjust the imaging position not only by the stage movement device 40 described later but also by moving the imaging camera 23 using the camera stage 25.

Moreover, a pair of lighting units 26 is disposed below the lens unit 24. The lighting units 26 are for irradiating a light onto the imaging position of the imaging camera 23 and are configured to provide sufficient illuminance necessary for imaging the behavior of a minute void.

Figure 4A:
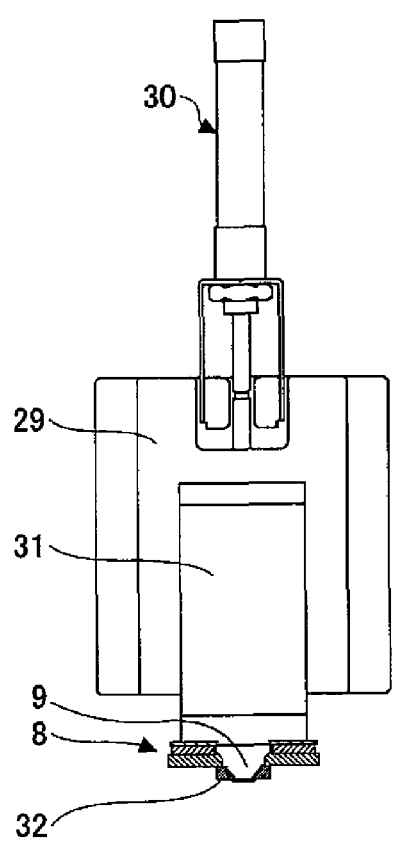
FIG. 4A is a front view showing a structure in a vicinity of a head movement mechanism of an observation apparatus according to an embodiment of the present invention.
Figure 4B:
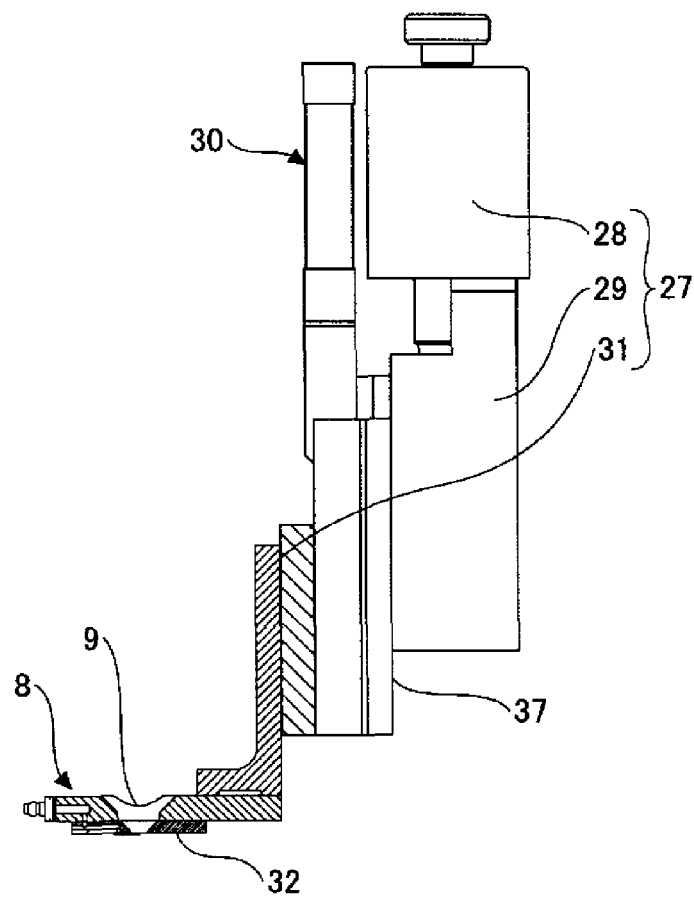
FIG. 4B is a right side view showing a structure in a vicinity of a head movement mechanism of an observation apparatus according to an embodiment of the present invention.
Figure 4C:
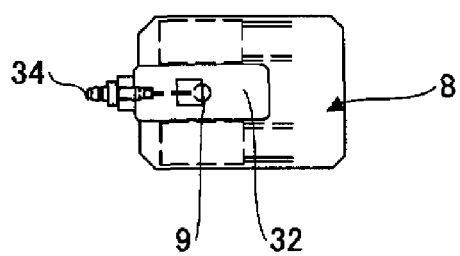
FIG. 4C is a bottom view showing a structure in a vicinity of a head movement mechanism of an observation apparatus according to an embodiment of the present invention.

As shown in FIGS. 4A and 4B in an enlarged manner, the head movement mechanism 27 includes a head driving motor 28, a fixed stage 29, the pressure regulating mechanism 30, a head holder 31, and the like. The fixed stage 29 is fixed on the support plate 22 and the head driving motor 28 is disposed on an upper portion of the fixed stage 29.

The fixed stage 29 internally includes an elevation mechanism (not shown in the drawings) for moving a base plate 37 upward and downward via the head driving motor 28 as a driving source and the head holder 31 is installed on the base plate 37 via the pressure regulating mechanism 30. Thus, when the head holder 31 moves upward or downward, the pressure regulating mechanism 30 and the head holder 31 also move upward or downward in accordance with this.

The attraction head B is disposed at a lower end of the head holder 31. The attraction head 8 is disposed so as to extend in the horizontal direction. In other words, the attraction head 8 is fixed on the head holder 31 so as to be in parallel with the installation stage 10 described later.

Figure 5A:
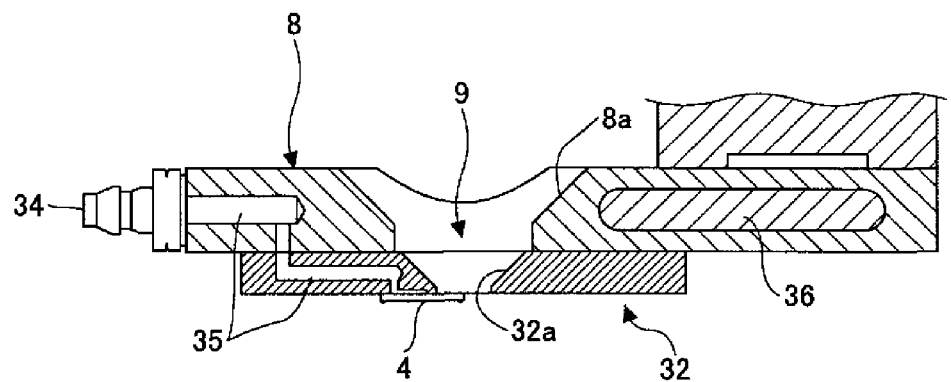
FIG. 5A is a cross-sectional view showing an attraction head of an observation apparatus according to an embodiment of the present invention.

With reference to FIG. 5A, a structure of the attraction head B is described. The attraction head 8 includes the first opening 9, a chip attraction portion 32, an attraction joint 34 for a head, a heater 36 for a chip, and the like.

In the attraction head 8, the chip attraction portion 32 is disposed on a lower surface thereof. An opening 8a is formed on the attraction head 8 and an opening 32a is formed on the chip attraction portion 32 such that the opening 8a and the opening 32a form the first opening 9 in cooperation with each other. The first opening 9 is a penetrating hole penetrating the attraction head 8 and the chip attraction portion 32 and is formed to be coaxial relative to an optical axis of the above-mentioned observation unit 3 (imaging camera 23 and lens unit 24). In accordance with this, the observation unit 3 is capable of imaging below the first opening 9 via the first opening 9. In this embodiment, the observation unit 3 and first opening 9 are disposed in an opposing manner.

Further, an attraction piping 35 is formed in the attraction head 8 and the chip attraction portion 32. The attraction joint 34 for a head is connected to one end of the attraction piping 35 (left end in FIG. 5A) and the other end of the attraction piping 35 is open in the vicinity of the opening 32a of the chip attraction portion 32. The attraction joint 34 for a head is connected to an attraction device 47 for a chip including a vacuum pump (refer to FIG. 11) and attraction is performed at the other end of the attraction piping 35 by driving the attraction device 47 for a chip.

A glass chip used as the body 4 to be mounted is attached at a position on the chip attraction portion 32 where the other end of the attraction piping 35 is open. In this case, the glass chip 4 is attracted to the chip attraction portion 32 through suction (negative pressure) of the vacuum pump, so that the glass chip 4 is held (attached) on the chip attraction portion 32. In this attachment (attraction) status, the glass chip 4 is attached such that a portion of the glass chip 4 extends in the first opening 9. In addition, a diameter at a lowermost portion of the first opening 9 is 2 mm, for example.

The attraction head 8 internally includes the heater 36 for a chip. Heat generated in the heater 36 for a chip is conducted to the glass chip 4 via the attraction head 8 and the chip attraction portion 32. In other words, the glass chip 4 is configured such that a temperature thereof is controlled by the heater 36 for a chip.

As mentioned above, the glass chip 4 is held by being attracted to the attraction head B. Further, the attraction head 8 is configured to be moved upward or downward by the above-mentioned head movement mechanism 27, so that the glass chip 4 is also moved upward or downward in accordance with the vertical movement of the attraction head 8.

The pressure regulating mechanism 30 is disposed between the head holder 31 and the base plate 37. The pressure regulating mechanism 30 employs an air cylinder, for example, and is configured to function such that a constant pressure is provided when the head holder 31 is lowered by the head movement mechanism 27 and the glass chip 4 is pressed on the glass substrate 5 as mentioned later.

Figure 2:
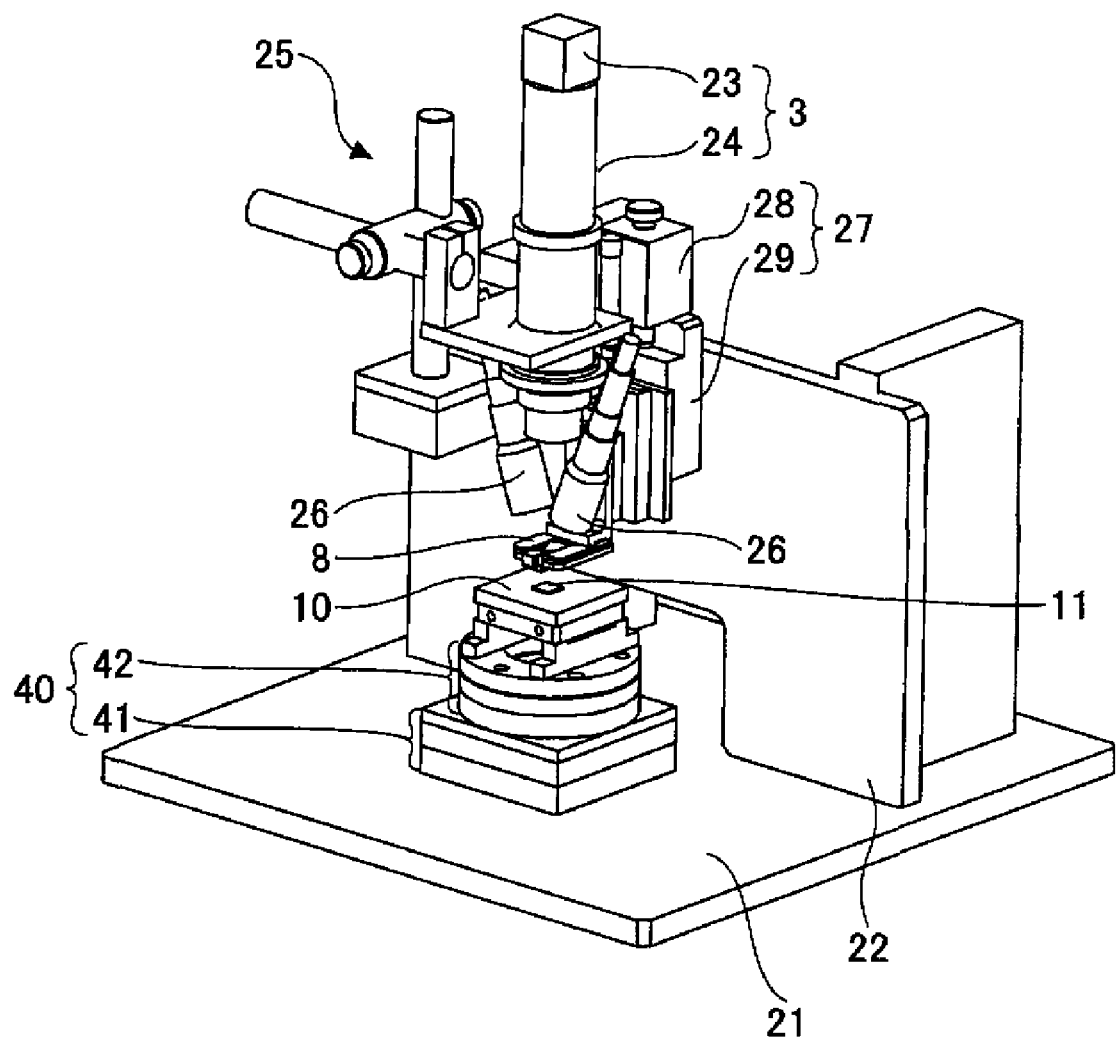
FIG. 2 is a perspective view showing an observation apparatus according to an embodiment of the present invention.

Next, a mechanism disposed on the base 21 is described. As shown in FIGS. 2, 3A, and 3B, the installation stage 10, the stage movement device 40, and the like are disposed on the base 21.

The stage movement device 40 includes an X-Y stage 41 and a θ stage 42. The installation stage 10 is disposed above the stage movement device 40.

The X-Y stage 41 has a function of moving the installation stage 10 in a lateral direction (X-Y directions) relative to the base 21. Further, the θ stage 42 has a function of rotating the installation stage 10. In accordance with this, the installation stage 10 is configured to be movable in a given position by the stage movement device 40.

Figure 5B:
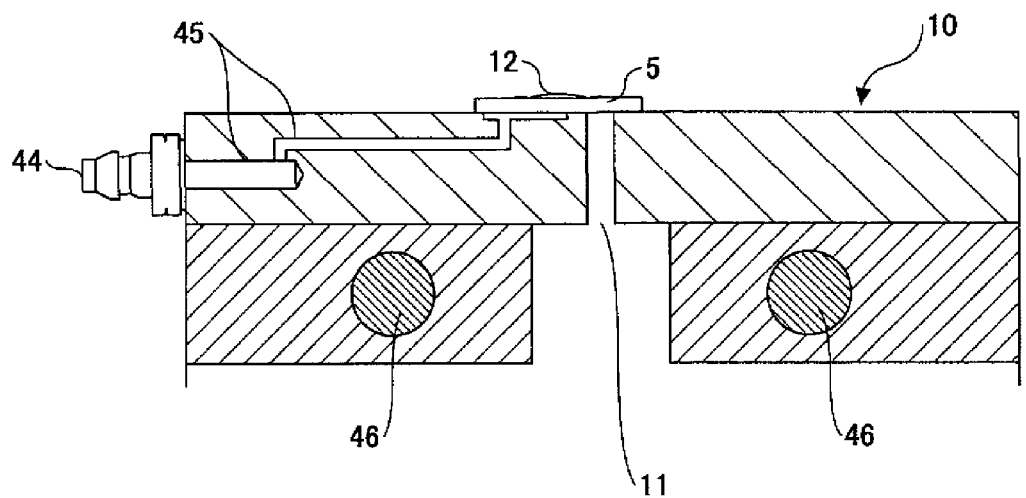
FIG. 5B is a cross-sectional view showing an installation stage of an observation apparatus according to an embodiment of the present invention.
Figure 6:
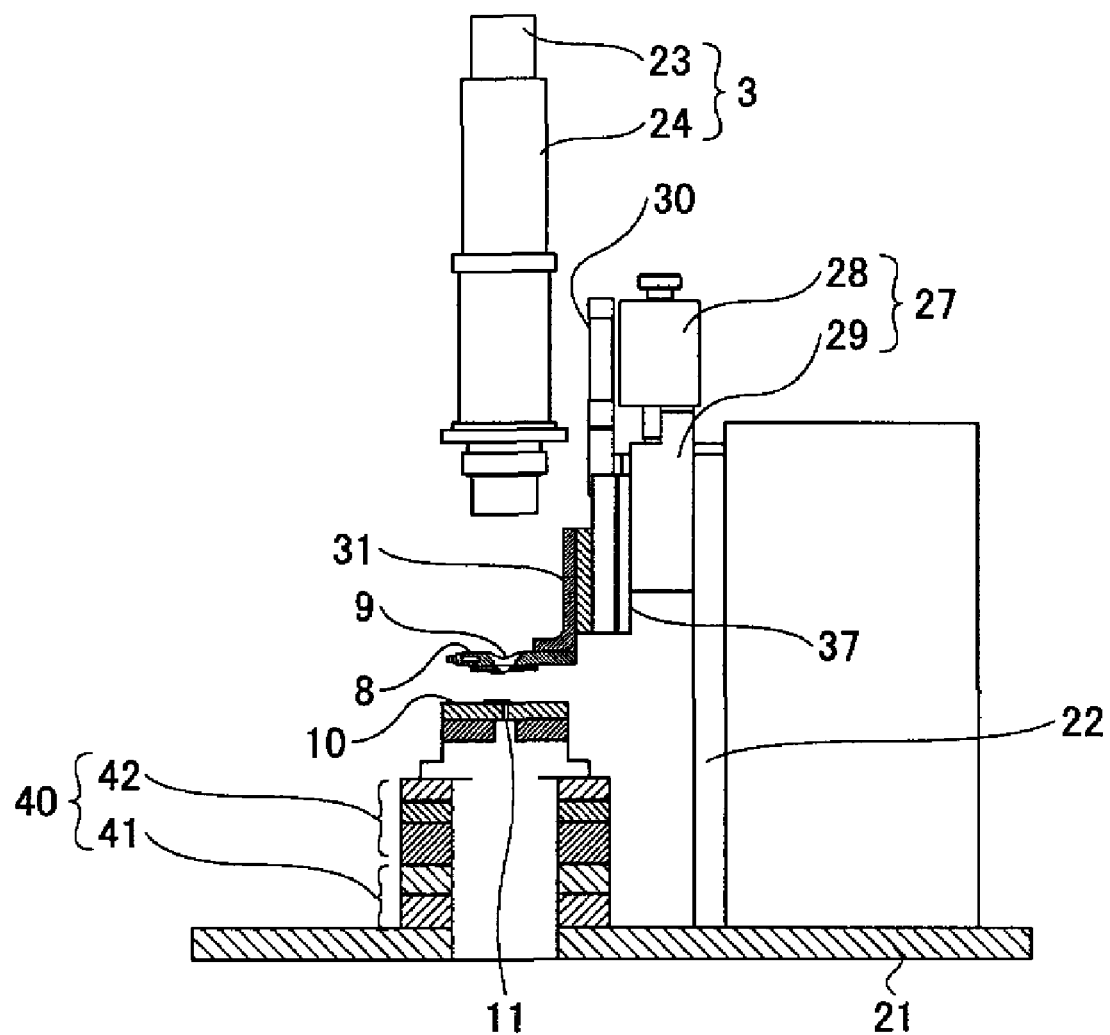
FIG. 6 is a partially-sectioned right side view showing an observation apparatus according to an embodiment of the present invention.

As shown in FIG. 5B, the installation stage 10 includes the second opening 11, an attraction joint 44 for a substrate, an attraction piping 45, a heater 46 for a substrate, and the like. The second opening 11 is a penetrating hole penetrating the installation stage 10 and is not necessarily disposed on the observation apparatus 20 configured as shown in FIGS. 2, 3A, 3B, and 6.

Figure 7:
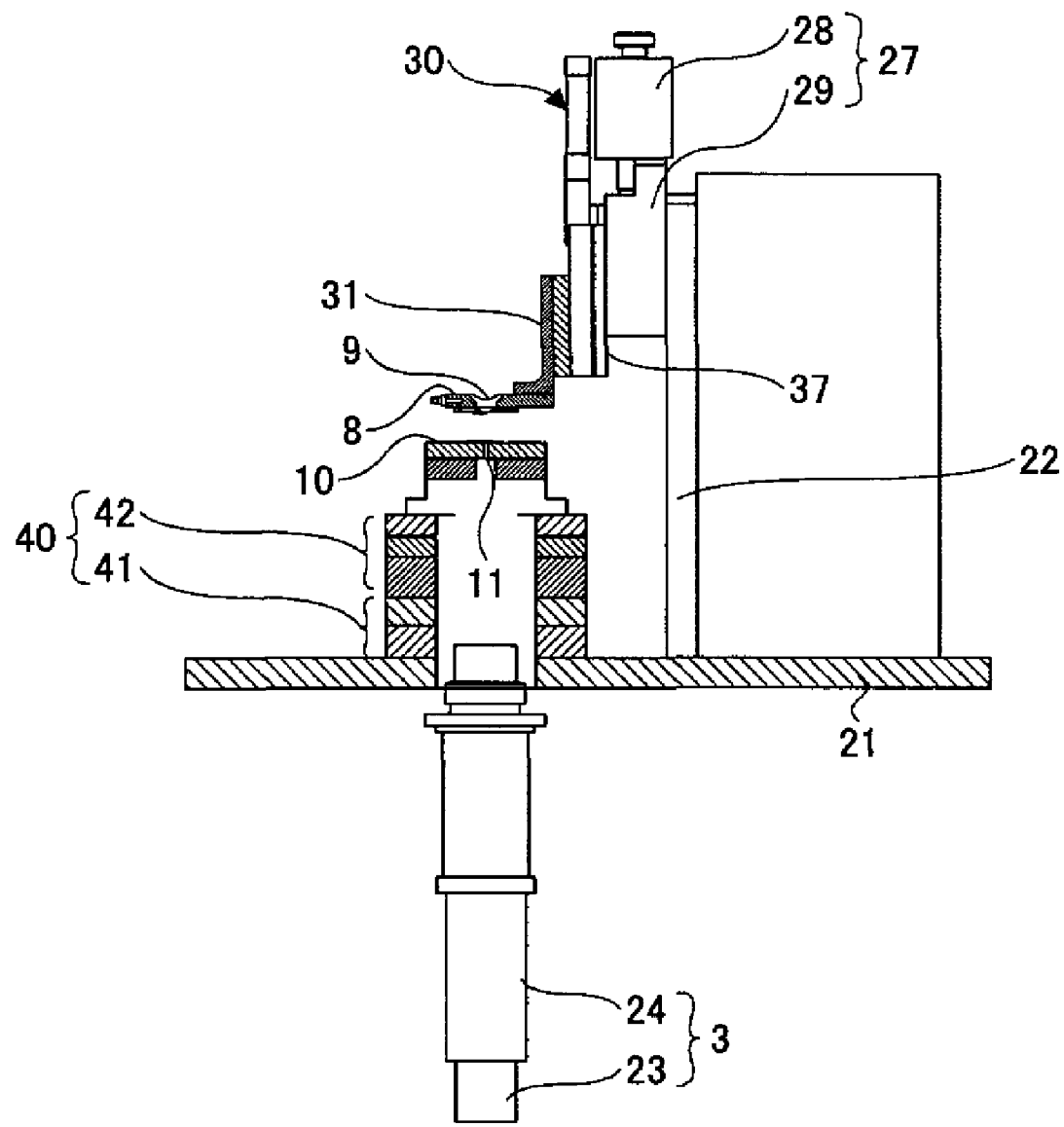
FIG. 7 is a partially-sectioned right side view showing an observation apparatus in which an imaging camera is disposed below an installation stage.

However, as in the present embodiment, by forming the second opening 11 in the installation stage 10, it is possible to observe a void generated between the glass chip 4 and the glass substrate 5 from a bottom side by disposing the observation unit 3 below the installation stage 10 as shown in FIG. 7.

Further, the attraction piping 45 is formed in the installation stage 10. The attraction joint 44 for a substrate is connected to one end of the attraction piping 45 (left end in FIG. 5B) and the other end of the attraction piping 45 is open in the vicinity of the second opening 11 of the installation stage 10. The attraction joint 44 for a substrate is connected to an attraction device 48 for a substrate including a vacuum pump (refer to FIG. 11) and attraction is performed at the other end of the attraction piping 45 by driving the attraction device 48 for a substrate.

The glass substrate 5 is attached at a position on the chip attraction portion 32 where the other end of the attraction piping 35 is open. In this case, the glass substrate 5 is attracted to the installation stage 10 through suction (negative pressure) of the vacuum pump, so that the glass substrate 5 is held (attached) on the installation stage 10. In this attachment (attraction) status, the glass substrate 5 is attached so as to close the second opening 11.

The installation stage 10 internally includes the heater 46 for a substrate. Heat generated in the heater 46 for a substrate is conducted to the glass substrate 5 via the installation stage 10. In other words, the glass substrate 5 is configured such that a temperature thereof is controlled by the heater 46 for a substrate.

In the following, the glass chip 4 and the glass substrate 5 used in the present embodiment are described. In the present embodiment, the glass chip 4 is assumed to be a semiconductor chip and the glass substrate 5 is assumed to be a mounting substrate. A method for observing the behavior of the underfill resin 12 is used on the basis of this assumption, the underfill resin 12 being set between the glass chip 4 and the glass substrate 5 upon mounting the glass chip 4 on the glass substrate 5.

Figure 8A:
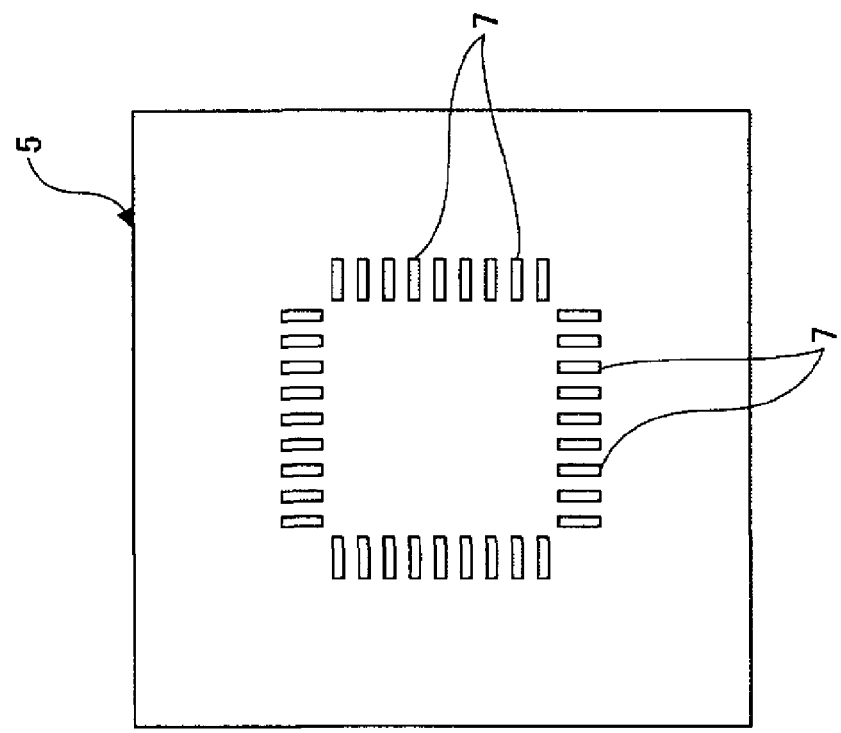
FIG. 8A is a plan view showing a glass substrate.
Figure 8B:
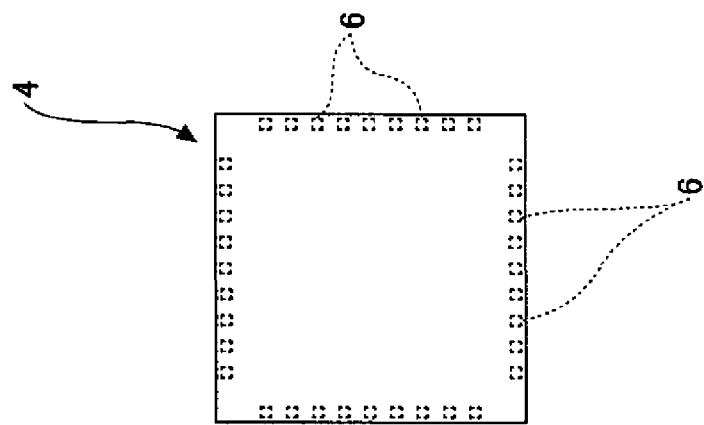
FIG. 8B is a plan view showing a glass chip.

In this case, preferably, the glass chip 4 and the glass substrate 5 are similar to an actual semiconductor chip and an actual mounting substrate. Accordingly, in the present embodiment, as shown in FIG. 8A, the electrode 7 is formed on the glass substrate 5 in the same manner as in an actual semiconductor chip and the bump 6 is formed on the glass chip 4 in the same manner as in an actual semiconductor chip.

Figure 9:
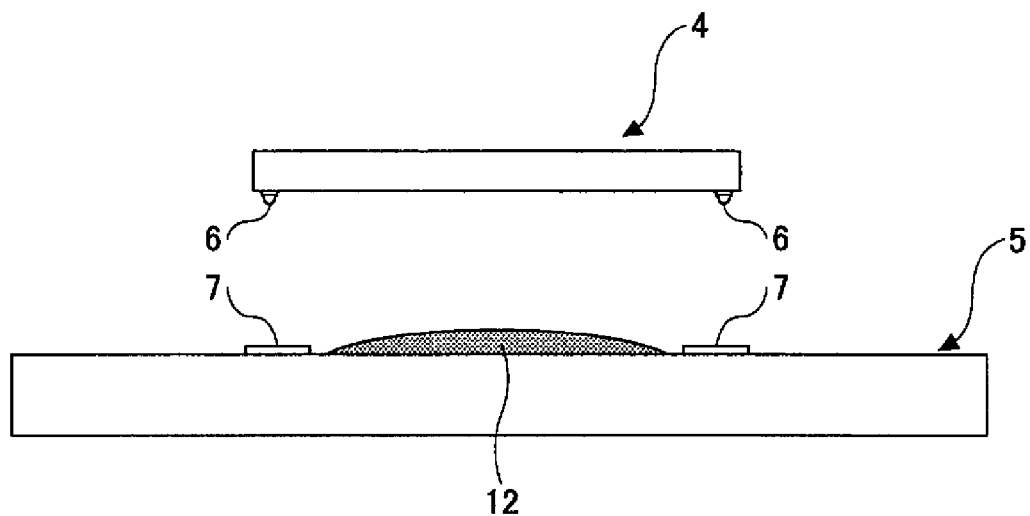
FIG. 9 is a diagram showing a status immediately before a glass chip is mounted on a glass substrate.

Accordingly, as shown in FIG. 9, the underfill resin 12 is placed on an area of the glass substrate 5 where the glass chip 4 is to be mounted, and then the glass chip 4 is mounted on the glass substrate 5 in this status as shown in FIG. 9. In accordance with this, the underfill resin 12 behaves (flows) substantially in the same manner as when the actual semiconductor chip is mounted on the actual mounting substrate. Thus, the void 13 generated in the underfill resin 12 between the glass chip 4 and the glass substrate 5 is generated substantially in the same process and at the same position as when the actual semiconductor chip is mounted on the actual mounting substrate. Further, the glass chip 4 and the glass substrate 5 are transparent, so that it is possible to observe a status of the underfill resin 12 from outside the glass chip 4 and the glass substrate 5.

Thus, when the status of the underfill resin 12 and void 13 is to be observed from above the glass chip 4, the observation unit 3 is disposed above the glass chip 4 as shown in FIGS. 2, 3A, 3B, and 6, so that it is possible to observe the status of the underfill resin 12 and the void 13 via the first opening 9 and the glass chip 4. Further, when the status of the underfill resin 12 and the void 13 is to be observed from blow the glass substrate 5, the observation unit 3 is disposed below the glass substrate 5 as shown in FIG. 7, so that it is possible to observe the status of the underfill resin 12 and the void 13 via the second opening 11 and the glass substrate 5.

When the status of the underfill resin 12 and the void 13 is to be observed from above the glass chip 4, the glass substrate 5 is not necessarily used and the actual mounting substrate may be used. Or, when the status of the underfill resin 12 and the head holder 31 is to be observed from below the glass substrate 5, the glass chip 4 is not necessarily used and the actual semiconductor chip may be used. In this case, the actual mounting substrate or the actual semiconductor chip is used for the chip or the substrate, so that it is possible to further approximate the behavior of the underfill resin 12 and the void 13.

Figure 11:
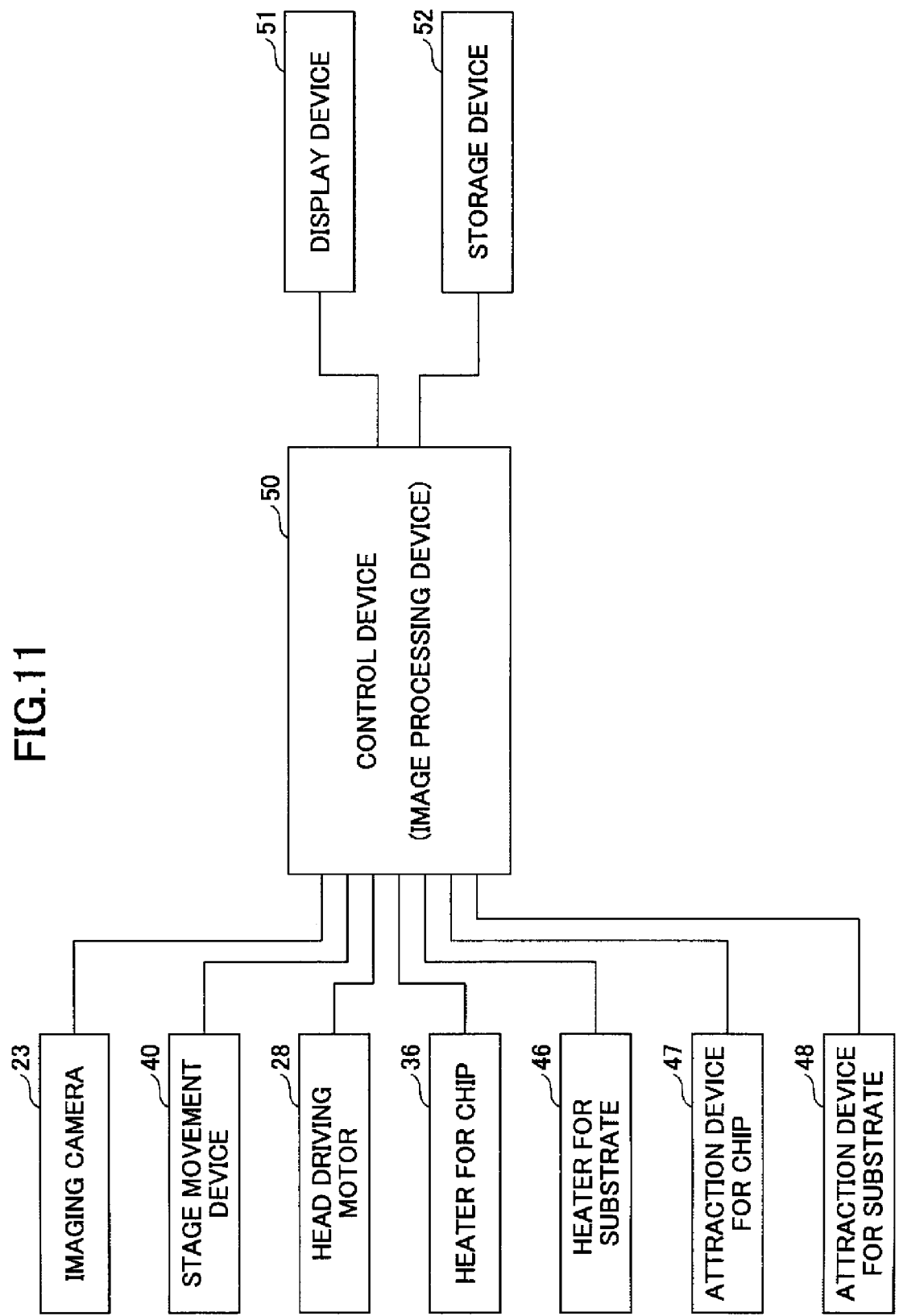
FIG. 11 is a block diagram showing a structure of a control system of an observation apparatus according to an embodiment of the present invention.

FIG. 11 is a block diagram showing a structure of a control system of the above-mentioned observation apparatus 20. In the present embodiment, a personal computer having an image processing function is used as the control device 50. In the control device 50, the imaging camera 23, head driving motor 28, heater 36 for a chip, stage movement device 40, heater 46 for a substrate, attraction device 47 for a chip, and attraction device 48 for a substrate are connected thereto via a driving device not shown in the drawings or I/O, for example. Moreover, in the control device 50, a display device 51 is connected thereto as an output unit and a storage device 52 storing image data is connected thereto.

Figure 12:
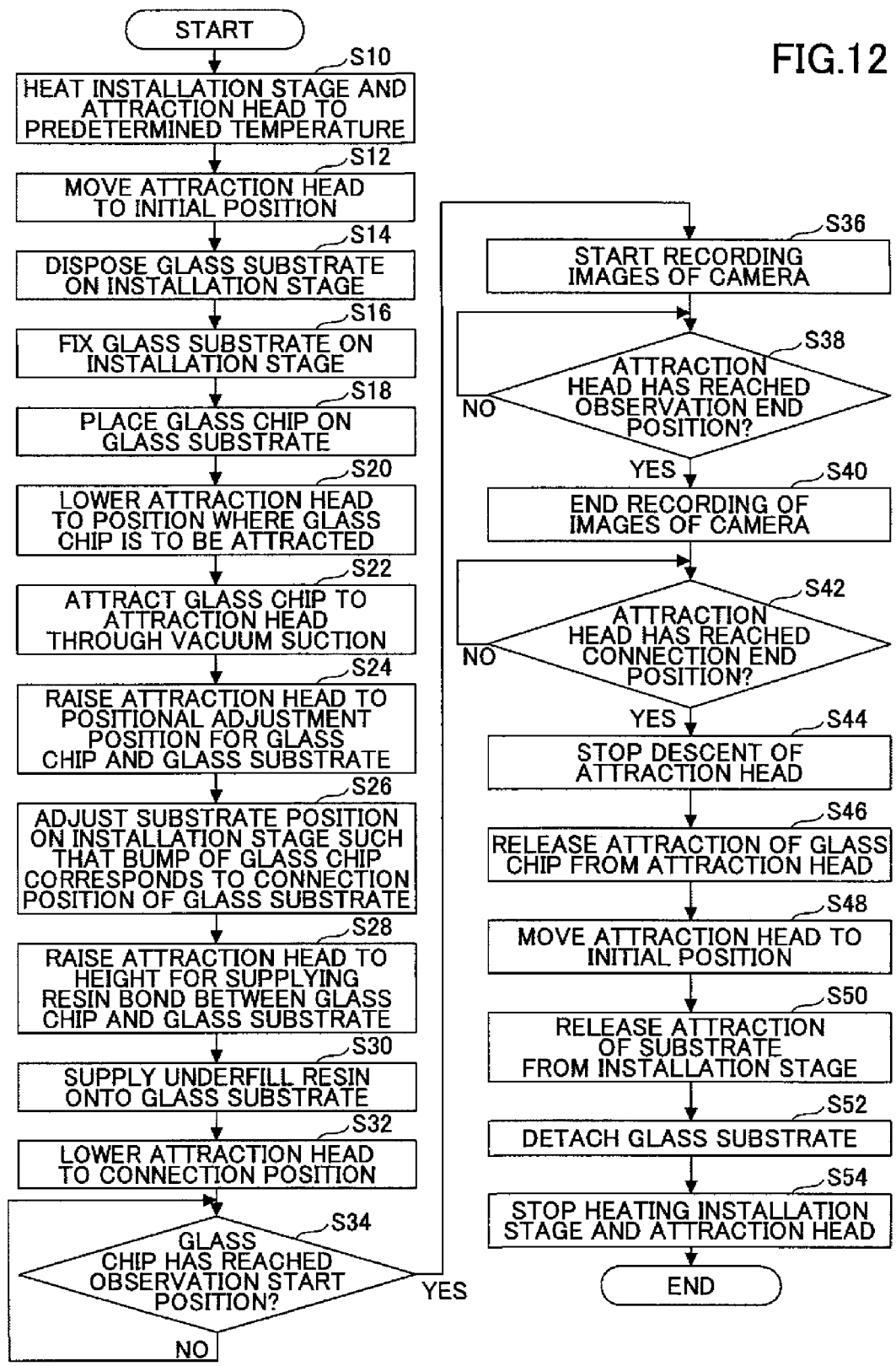
FIG. 12 is a flowchart showing a void observation process performed by a control device.

The following describes a void observation process performed by the control device 50 in the observation apparatus 20 having the above-mentioned structure. FIG. 12 is a flowchart showing a void observation process performed by the control device 50.

When the void observation process shown in FIG. 12 is activated, in step 10 (abbreviated as S in the drawings), the heater 36 for a chip and the heater 46 for a substrate are activated so as to heat the attraction head 8 (chip attraction portion 32) and the installation stage 10. Subsequently, the head driving motor 28 constituting the head movement mechanism 27 is driven so as to move the attraction head 8 to a position of an uppermost portion (initial position) thereof (step 12).

In this status, the glass substrate 5 is disposed on the installation stage 10 (step 14). This step of disposing the glass substrate 5 on the installation stage 10 may be performed using a transfer robot 71 as mentioned later or may be manually performed. Then, the control device 50 activates the attraction device 48 for a substrate and fixes the glass substrate 5 on the installation stage 10 (step 16).

In the following step, the glass chip 4 is placed on the glass substrate 5 (step 18). This step is manually performed. Further, precision of a position where the glass chip 4 is placed is sufficient as long as the glass chip 4 is placed on the glass substrate 5 with visual observation of an operator such that the bump 6 formed on the glass chip 4 corresponds to the electrode 7 of the glass substrate 5.

When the information that the glass chip 4 is placed on the glass substrate 5 is input to the control device 50, the control device 50 activates the head driving motor 28 and lowers the attraction head 8 from the initial position (step 20). When the attraction head 8 (chip attraction portion 32) is brought into contact with the glass chip 4, the descent of the attraction head 8 is stopped.

Next, the control device 50 activates the attraction device 47 for a chip and allows the glass chip 4 to be attracted to the attraction head 8 through vacuum suction (step 22). The glass chip 4 is merely placed on the glass substrate 5 in step 18, so that the glass chip 4 is attached (held) to the attraction head 8 using the attraction through the vacuum suction.

As mentioned above, when the glass chip 4 is attached to the attraction head 8, the control device 50 drives the head driving motor 28 again and raises the attraction head 8 to a predetermined positional adjustment position using the head movement mechanism 27 (step 24). Then, the control device 50 drives the stage movement device 40 (X-Y stage 41 and θ stage 42) so as to adjust a position of the glass substrate 5 such that the bump 6 of the glass chip 4 corresponds to a position where the electrode 7 of the glass substrate 5 is formed (step 26). It is possible to apply a positioning technique in normal flip-chip mounting to the above-mentioned positioning by disposing an alignment mark on the glass chip 4, for example.

When the step of positioning the glass substrate 5 in the X-Y directions and the θ direction is ended, the control device 50 drives the head driving motor 28 and raises the attraction head 8 again while maintaining this positioning status (step 28). This ascent step is performed until a position of the attraction head 8 is raised such that the underfill resin 12 can be supplied to the glass substrate 5.

Subsequently, the underfill resin 12 is supplied onto the glass substrate 5 attracted to the installation stage 10 (step 30). This step of supplying the underfill resin 12 may be manually performed or may be automatically performed by using an automatic supply device with a dispenser.

When the underfill resin 12 is supplied onto the glass substrate 5, as mentioned above, the control device 50 drives the head driving motor 28 again and lowers the attraction head 8 (step 32). In this case, the bump 6 of the glass chip 4 attracted to the attraction head 8 and the electrode 7 of the glass substrate 5 attracted to the installation stage 10 are maintained to be positioned with high precision.

While the attraction head 8 is lowered, the control device 50 judges whether the glass chip 4 has reached an observation start position. Examples of methods used for the judgment include (1) a method in which a distance measurement mechanism for measuring a distance of movement of the attraction head 8 is embedded inside the fixed stage 29 and whether the glass chip 4 has reached the observation start position is judged in accordance with a signal from the distance measurement mechanism, (2) a method in which a detection sensor capable of detecting the glass chip 4 (or the attraction head 8) is installed on the installation stage 10 and whether the glass chip 4 has reached the observation start position is judged in accordance with a signal from the detection sensor, and the like. The process in step 34 continues until the glass chip 4 reaches the observation start position. In addition, in the present embodiment, a position where the glass chip 4 is brought into contact with the underfill resin 12 on the glass substrate 5 is used as the observation start position.

On the other hand, in the attraction joint 34 for a head, when the glass chip 4 is judged to have reached the observation start position, the process proceeds to step 36 and the control device 50 activates the imaging camera 23. In accordance with this, the imaging camera 23 starts imaging the behavior of the underfill resin 12 via the first opening 9, the underfill resin 12 being held between the glass chip 4 and the glass substrate 5.

Imaging data on images of the underfill resin 12 generated in the imaging camera 23 is transmitted to the control device 50. As mentioned above, the control device 50 also functions as the image processing device, so that the imaging data transmitted from the imaging camera 23 is subjected to image processing such as various types of filtering in the control device 50 and is processed to be image data which can be displayed on the display device 51. The image data is transmitted to the storage device 52 and stored (recorded) therein.

In the following step, the control device 50 judges whether the attraction head 8 has reached an observation end position (step 38). The observation end position is where the bump 6 of the glass chip 4 is connected to the electrode 7 of the glass substrate 5 and the mounting process is ended. If a negative judgment (NO) is made in step 38, the attraction head 8 has not reached the position where the glass chip 4 is mounted on the glass substrate 5. Accordingly, the control device 50 continues to lower the attraction head 8 (glass chip 4).

Figure 10:
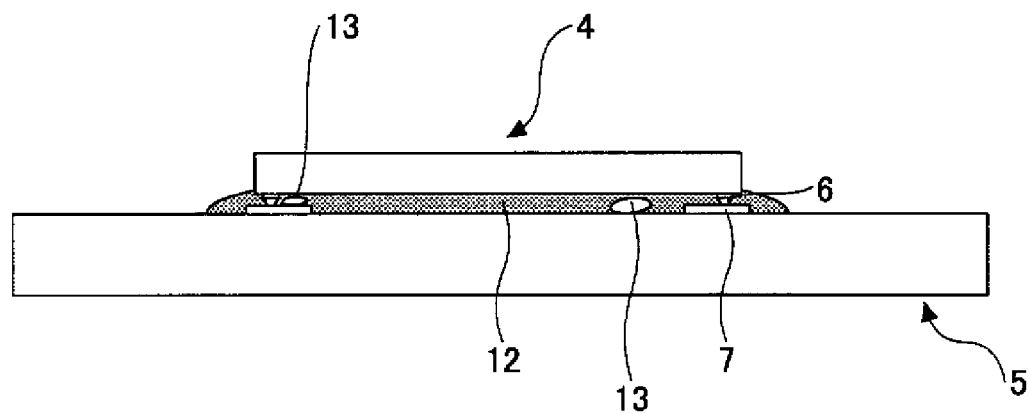
FIG. 10 is a diagram showing a status where a void is generated by mounting a glass chip on a glass substrate.

While the attraction head 8 is lowered, the glass chip 4 is brought close to the glass substrate 5, the underfill resin 12 supplied onto the glass substrate 5 is pressed by the glass chip 4 and spread, and a portion of the underfill resin 12 protrudes outside the glass chip 4 as shown in FIG. 10.

In this case, the glass chip 4 and the glass substrate 5 are heated by each of the heater 36 for a chip and the heater 46 for a substrate so as to have the same temperature as those of the actual semiconductor chip and the actual mounting substrate upon mounting. In accordance with this, the underfill resin 12 behaves in the same manner as when the actual semiconductor chip is mounted on the actual mounting substrate. Further, it is possible to vary pressure of the glass chip 4 applied for pressing the underfill resin 12 by adjusting the head movement mechanism 27 and the pressure regulating mechanism 30. Thus, the pressure of the glass chip 4 applied for pressing the underfill resin 12 is adjusted to have the same pressure applied upon mounting the actual semiconductor chip on the actual mounting substrate.

The imaging camera 23 images the behavior of the underfill resin 12 being spread. The void 13 is known to be generated in the underfill resin 12 when the underfill resin 12 is spread. Accordingly, when the behavior of the underfill resin 12 being spread is imaged, the status of the void 13 upon generation is imaged.

When the attraction head 8 is judged to have reached the observation end position in step 38, the control device 50 ends the imaging using the imaging camera 23 (step 40). Further, when the attraction head 8 is judged to have reached a connection end position in the following step 42, the control device 50 stops the head driving motor 28 and stops the descent of the attraction head 8 (step 44).

Subsequently, the control device 50 stops the attraction device 47 for a chip and releases the attraction of the glass chip 4 from the attraction head 8 (step 46), and then the control device 50 drives the head driving motor 28 and raises the attraction head 8 to the initial position (step 48). Further, the control device 50 stops the attraction device 48 for a substrate and releases the attraction of the glass substrate 5 from the installation stage 10 (step 50).

When the attraction of the glass substrate 5 is released, the glass substrate 5 is detached from the installation stage 10 (step 52). The detachment from the installation stage 10 may be performed using the transfer robot 71 (refer to FIG. 14) or may be manually performed. When the glass substrate 5 is detached from the installation stage 10, the control device 50 stops the heater 36 for a chip and the heater 46 for a substrate (step 54) and the above-mentioned series of void observation steps are ended.

As mentioned above, in the void observation steps using the observation apparatus 20, the step of pressing the underfill resin 12 using the glass chip 4 is performed based on the same conditions under which the actual semiconductor chip is mounted on the actual substrate. In accordance with this, the underfill resin 12 behaves in the same manner as when the actual semiconductor chip is mounted on the actual substrate and the imaging camera 23 is capable of imaging the behavior (flow status) of the underfill resin 12 in a real-time manner. Thus, by analyzing the behavior of the imaged underfill resin 12, it is possible to determine a cause of the generation of the void 13.

Figure 13:
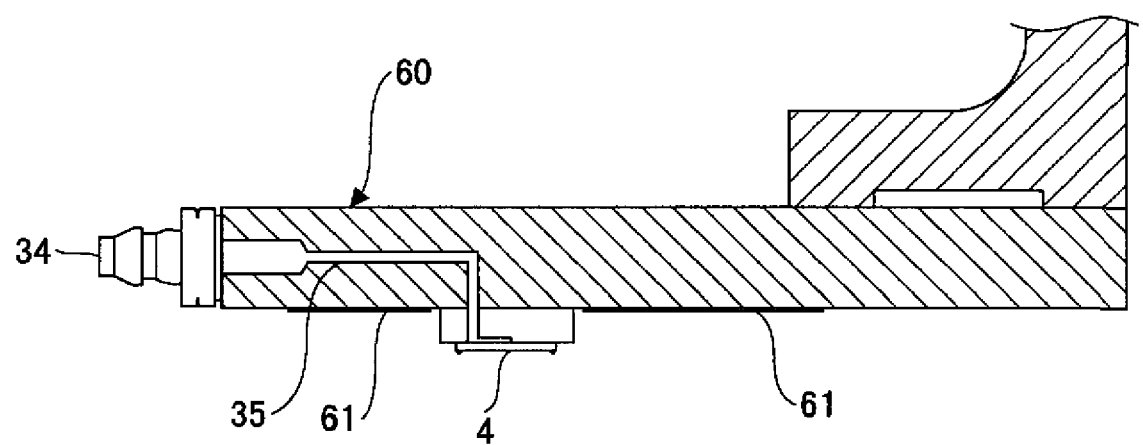
FIG. 13 is a cross-sectional view showing a variation of an attraction head constructed using glass.

FIG. 13 is a cross-sectional view showing an attraction head 60 as a variation of the attraction head 8 disposed on the above-mentioned observation apparatus 20. In addition, in FIG. 13, the same numerals are assigned to the same constituent elements as in the attraction head 8 and description thereof is omitted.

An entire portion of the attraction head 60 according to the present variation is formed using transparent glass. In accordance with this structure, it is possible to observe the behavior of the underfill resin 12 from above the attraction head 60 without forming a penetrating hole in the attraction head 60.

Further, a heater is required be disposed on the attraction head 60 so as to raise the temperature of the glass chip 4, so that a transparent heater 61 is employed as such a heater in the present variation. The transparent heater 61 is formed using a transparent heating element. Accordingly, when the transparent heater 61 is disposed, it is possible to observe a status below from a position where the transparent heater 61 is disposed through the attraction head 60.

In this manner, by forming the entire portion of the attraction head 60 using the transparent glass, the necessity of adjustment of the optical axis of the first opening 9 and that of the imaging camera 23 is eliminated in comparison with the above-mentioned attraction head 8 requiring such an adjustment. Further, in the attraction head 8, an illuminating light emitted from the lighting unit 26 is irradiated onto the imaging position via the first opening 9. However, by forming the entire portion of the attraction head 60 using the transparent glass, the illuminating light emitted from the lighting unit 26 is transmitted through an entire surface of the attraction head 60 and illuminates the imaging position. Thus, when the same lighting unit 26 is used, it is possible to increase illuminance at the imaging position in comparison with the case where the attraction head 8 is used.

Moreover, in the above-mentioned observation apparatus 20, the imaging camera 23 capable of imaging a light within the visible range is used and the behavior of the underfill resin 12 is imaged, for example. However, it is possible to use an X-ray camera capable of image processing in the X-ray range or an infrared camera capable of imaging in the infrared range as an imaging unit. By using these cameras, it is possible to observe the behavior of the underfill resin 12 and the generation of the void 13 using the actual semiconductor chip and the actual mounting substrate without using the glass chip 4 or the glass substrate 5.

Figure 14:
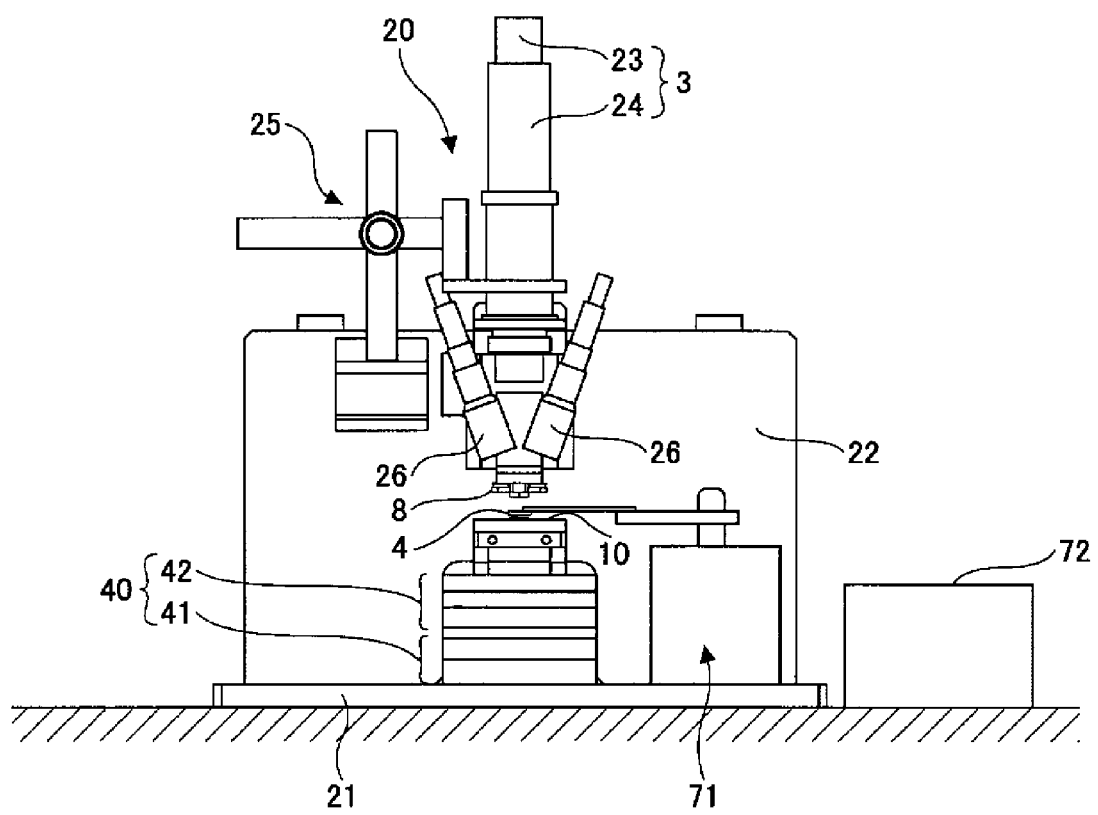
FIG. 14 is a front view showing a mounting apparatus to which an observation apparatus according to an embodiment of the present invention is applied.
Figure 15:
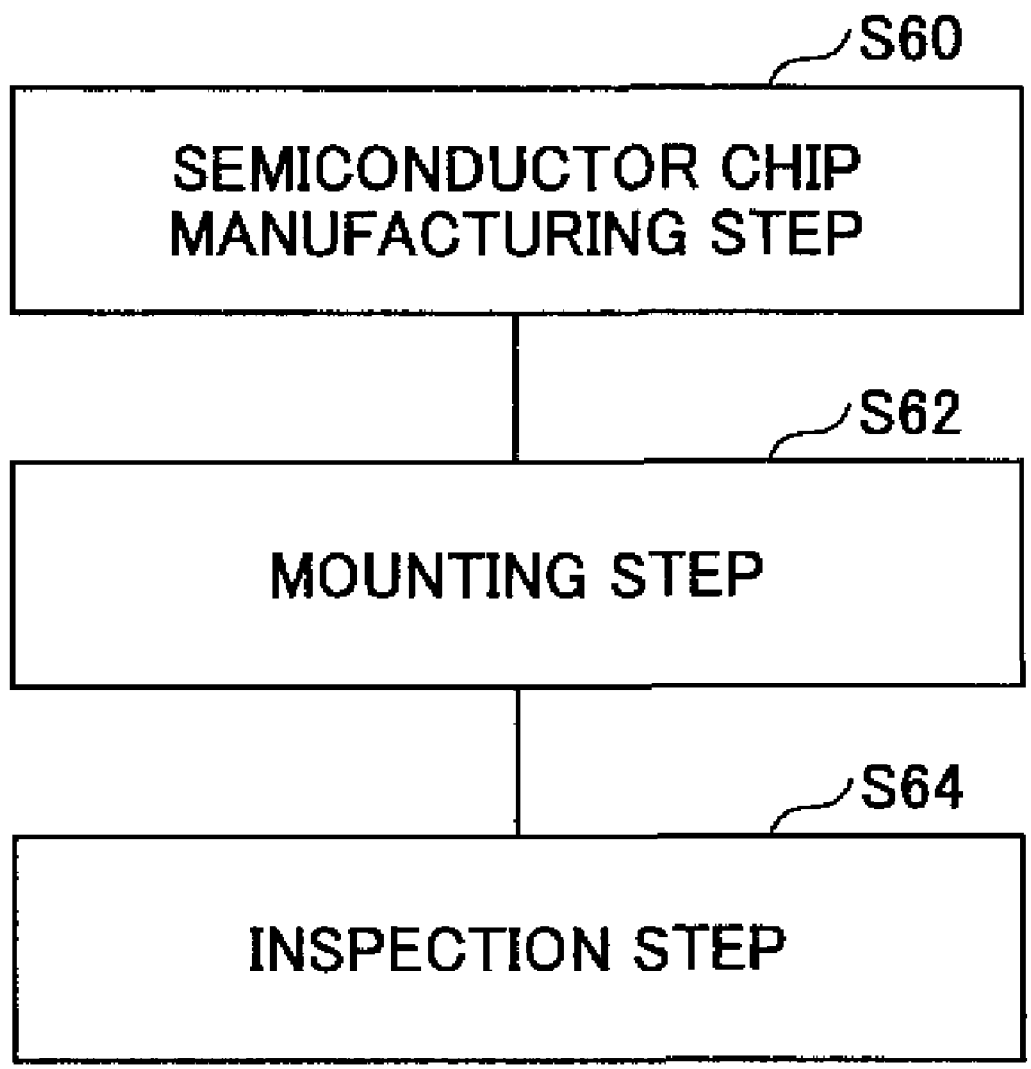
FIG. 15 is a flowchart showing an example of a method for manufacturing a semiconductor according to an embodiment of the present invention.

FIG. 14 is a front view showing a mounting apparatus 70 to which the observation apparatus 20 according to the present invention is applied. FIG. 15 is a flowchart showing steps of manufacturing an electronic device. FIG. 15 describes an example of a device in which a semiconductor chip is mounted on a mounting substrate as the electronic device.

The steps of manufacturing the semiconductor device substantially include a semiconductor chip manufacturing step (step 60), a mounting step (step 62), and an inspection step (step 64) as shown in FIG. 15. In the semiconductor chip manufacturing step, a circuit is formed by performing a diffusion treatment, a film formation process, an exposure and development process, and the like on a wafer. Then, packaging is performed as appropriate, a bump is formed, and dicing is performed, thereby manufacturing a semiconductor chip.

In the following mounting step, the semiconductor chip manufactured in the semiconductor chip manufacturing step is mounted on the mounting substrate using the mounting apparatus 70 as mentioned later. In accordance with this, an electronic device on which the semiconductor chip is mounted on the mounting substrate is manufactured. Subsequently, the inspection step including a reliability test, for example, is performed on the electronic device manufactured in this manner and those devices that have passed the inspection are shipped.

In the following, the mounting step in step 62 is described. The mounting step is performed using the mounting apparatus 70 shown in FIG. 14. Although a basic structure of the mounting apparatus 70 is the same as that of the observation apparatus 20 described with reference to FIGS. 1 to 12, the mounting apparatus 70 and the observation apparatus 20 are different in that the mounting apparatus 70 includes the X-ray camera as the imaging camera 23, the transfer robot 71 for attaching and detaching the semiconductor chip 4 as a body to be mounted, a transfer conveyer 72 for transferring the semiconductor chip and the electronic device between a device used in the semiconductor chip manufacturing step and a device used in the inspection step, and the like.

The mounting apparatus 70 functions as the mounting unit mounting the glass chip 4 on the mounting substrate in the same manner as in the observation apparatus 20. The mounting apparatus 70 includes the attraction head 8, installation stage 10, head movement mechanism 27, pressure regulating mechanism 30, and stage movement device 40. Thus, by using the mounting apparatus 70, it is possible to mount the semiconductor chip 4 on the mounting substrate.

Further, the mounting apparatus 70 includes the observation unit 3 constituted using the imaging camera 23 and the lens unit 24 in the same manner as in the observation apparatus 20. In accordance with this, when the semiconductor chip 4 is mounted on the mounting substrate, it is possible to image the behavior of the underfill resin 12 at the same timed using the imaging camera 23. Although image data obtained from the imaging performed in this manner is stored in the storage device 52, it is possible to calculate an amount of generation of void from the image data in the inspection step in step 64 and to judge those electronic devices having a large amount of generation as defective products. In accordance with this, it is possible to improve reliability of the electronic devices to be shipped.

Moreover, the image data is stored in the storage device 52 in each mounting of the semiconductor chip on the mounting substrate, so that it is possible to accumulate a large amount of image data obtained from the imaging of the behavior of the underfill resin 12 and the generation of void. Thus, by analyzing the large amount of image data, it is possible to accurately determine a mechanism of the generation of the void 13.

The present invention is not limited to the specifically disclosed embodiment, and variations and modifications may be made without departing from the scope of the present invention.

The present application is based on Japanese priority application No. 2007-030423 filed Feb. 9, 2007, the entire contents of which are hereby incorporated herein by reference.

What is claimed is:

1. An observation apparatus for observing a void generated in an underfill resin, the observation apparatus comprising:
 a mounting unit configured to mount a body to be mounted on a substrate in flip-chip mounting with the underfill resin between the body to be mounted and the substrate, the mounting unit including a head configured to hold the body to be mounted and a stage configured to have the substrate installed thereon; and
 an observation unit configured to observe the void generated in the underfill resin by observing behavior of the underfill resin during the mounting of the body to be mounted on the substrate by the mounting unit, the observation unit including an imaging unit configured to image the behavior of the underfill resin, the imaging unit being disposed at a position opposite to an opening formed at a position of the head for imaging the body to be mounted or a position of the stage for imaging the substrate.

2. The observation apparatus according to claim 1, wherein a heater configured to heat at least one of the body to be mounted and the substrate is disposed on at least one of the head and the stage.

3. An observation apparatus for observing a void generated in an underfill resin, the observation apparatus comprising:
   a mounting unit configured to mount a body to be mounted on a substrate in flip-chip mounting with the underfill resin between the body to be mounted and the substrate, the mounting unit including a head configured to hold the body to be mounted and a stage configured to have the substrate installed thereon; and
   an observation unit configured to observe the void generated in the underfill resin by observing behavior of the underfill resin during the mounting of the body to be mounted on the substrate by the mounting unit, the observation unit including an imaging unit configured to image the behavior of the underfill resin,
   wherein at least one of the head and the stage is formed using a transparent material.

4. The observation apparatus according to claim 2, wherein the heater is formed using a transparent heating element.

5. The observation apparatus according to claim 1, including further comprising:
   a pressure regulating unit regulating pressure of the head applied to the stage.

6. The observation apparatus according to claim 1, wherein the body to be mounted is a glass chip.

7. The observation apparatus according to claim 1, wherein the substrate is a glass substrate.

8. A method for observing a void generated in an underfill resin, the method comprising:
   mounting a body to be mounted on a substrate installed on a stage in flip-chip mounting with the underfill resin between the body to be mounted and the substrate;
   imaging a behavior of the underfill resin via an opening in the stage or a head holding the body to be mounted during said mounting using an imaging unit disposed at a position opposite to the opening; and
   observing the void generated in the underfill resin during said mounting by observing the behavior of the underfill resin imaged by said imaging.

* * * * *